(12) United States Patent
Doshi et al.

(10) Patent No.: US 12,276,677 B1
(45) Date of Patent: Apr. 15, 2025

(54) WAVEGUIDE ALIGNMENT SYSTEM WITH DUAL PLATES

(71) Applicant: SAGE Millimeter, Inc., Torrance, CA (US)

(72) Inventors: Dhanraj Vikram Doshi, Torrance, CA (US); Yonghui Shu, Rolling Hills Estates, CA (US)

(73) Assignee: SAGE Millimeter, Inc., Torrance, CA (US)

( * ) Notice: Subject to any disclaimer, the term of this patent is extended or adjusted under 35 U.S.C. 154(b) by 166 days.

(21) Appl. No.: 17/862,060

(22) Filed: Jul. 11, 2022

Related U.S. Application Data

(60) Provisional application No. 63/322,422, filed on Mar. 22, 2022.

(51) Int. Cl.
*H04B 3/46* (2015.01)
*G01R 1/04* (2006.01)
*G01R 1/067* (2006.01)
*G01R 31/28* (2006.01)
*H01P 3/12* (2006.01)

(52) U.S. Cl.
CPC ....... *G01R 1/0416* (2013.01); *G01R 31/2822* (2013.01)

(58) Field of Classification Search
CPC .......... G01R 1/02; G01R 1/04; G01R 1/0408; G01R 1/0416; G01R 31/28; G01R 31/282; G01R 31/2822; G01R 31/2824; H01P 3/12
See application file for complete search history.

(56) References Cited

U.S. PATENT DOCUMENTS

| | | | | |
|---|---|---|---|---|
| 5,854,559 A | * | 12/1998 | Miranda | G01R 31/2822 324/755.02 |
| 11,156,656 B1 | * | 10/2021 | Tsironis | G01R 27/32 |
| 2004/0247248 A1 | * | 12/2004 | Fasham | G02B 6/423 385/52 |
| 2008/0303613 A1 | * | 12/2008 | Lau | H01P 1/042 333/254 |
| 2009/0140750 A1 | * | 6/2009 | Sugiura | G01R 31/001 324/627 |
| 2014/0175946 A1 | * | 6/2014 | Wischnewskiy | H02N 2/08 310/323.06 |
| 2015/0168486 A1 | * | 6/2015 | Isaac | G01R 31/2822 324/756.02 |
| 2015/0362439 A1 | * | 12/2015 | Bayram | G01N 22/02 324/639 |
| 2017/0182576 A1 | * | 6/2017 | Teraoka | F16M 11/041 |
| 2018/0113187 A1 | * | 4/2018 | Vassilev | G01R 27/28 |
| 2019/0123411 A1 | * | 4/2019 | Carlred | H01P 1/042 |

\* cited by examiner

*Primary Examiner* — Huy Q Phan
*Assistant Examiner* — David B Frederiksen
(74) *Attorney, Agent, or Firm* — Van Pelt, Yi & James LLP

(57) ABSTRACT

A waveguide alignment system with dual plates is disclosed. The disclosed system comprises: a base component, a lower plate coupled to the base component, and an upper plate coupled to the lower plate, wherein the upper plate is configured to attach to an electronic testing equipment component.

19 Claims, 10 Drawing Sheets

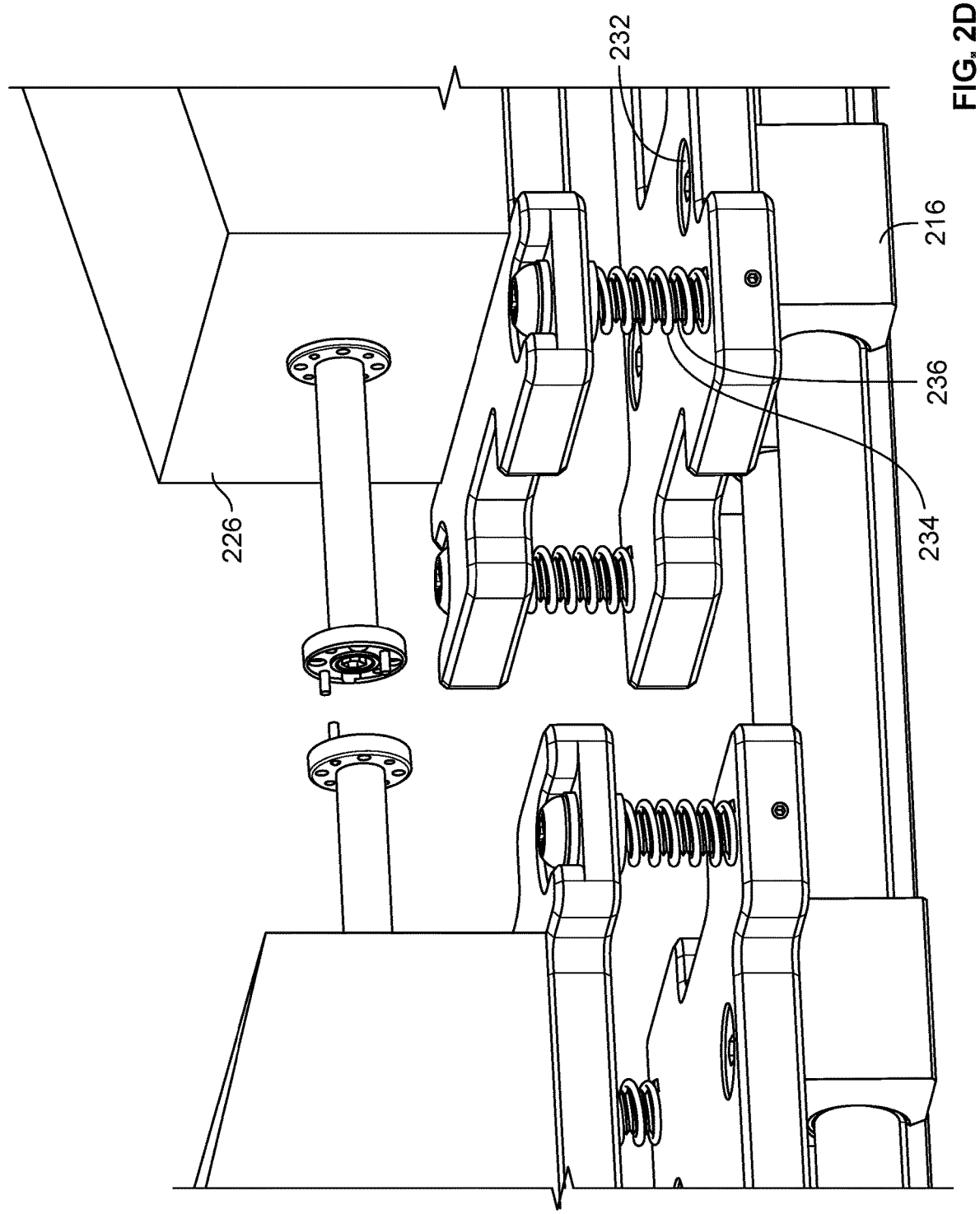

WAVEGUIDE ALIGNMENT SYSTEM WITH DUAL PLATES

CROSS REFERENCE TO OTHER APPLICATIONS

This application claims priority to U.S. Provisional Patent Application No. 63/322,422 entitled MILLIMETERWAVE VECTOR ANALYZER EXTENDER RAIL SYSTEM filed Mar. 22, 2022, which is incorporated herein by reference for all purposes.

BACKGROUND OF THE INVENTION

Radiofrequency (RF) engineering involves the design and testing of devices that produce or utilize signals within the radio band, a frequency range that extends from approximately 20 kilohertz (kHz) up to 300 gigahertz (GHz). Utilization of even higher frequencies, e.g., 1 terahertz (THz) and beyond, is also becoming increasingly common. Device testing at high electromagnetic wave frequencies is difficult in many scenarios because very precise alignment is required at these high frequencies. Small alignment errors can cause inaccurate and inconsistent testing results. Thus, it would be beneficial to develop techniques directed toward improving device testing at high electromagnetic wave frequencies.

BRIEF DESCRIPTION OF THE DRAWINGS

Various embodiments of the invention are disclosed in the following detailed description and the accompanying drawings.

FIGS. 2A-2E are diagrams illustrating an embodiment of a rail-mounted system for high-frequency device testing.

DETAILED DESCRIPTION

Figure 1:
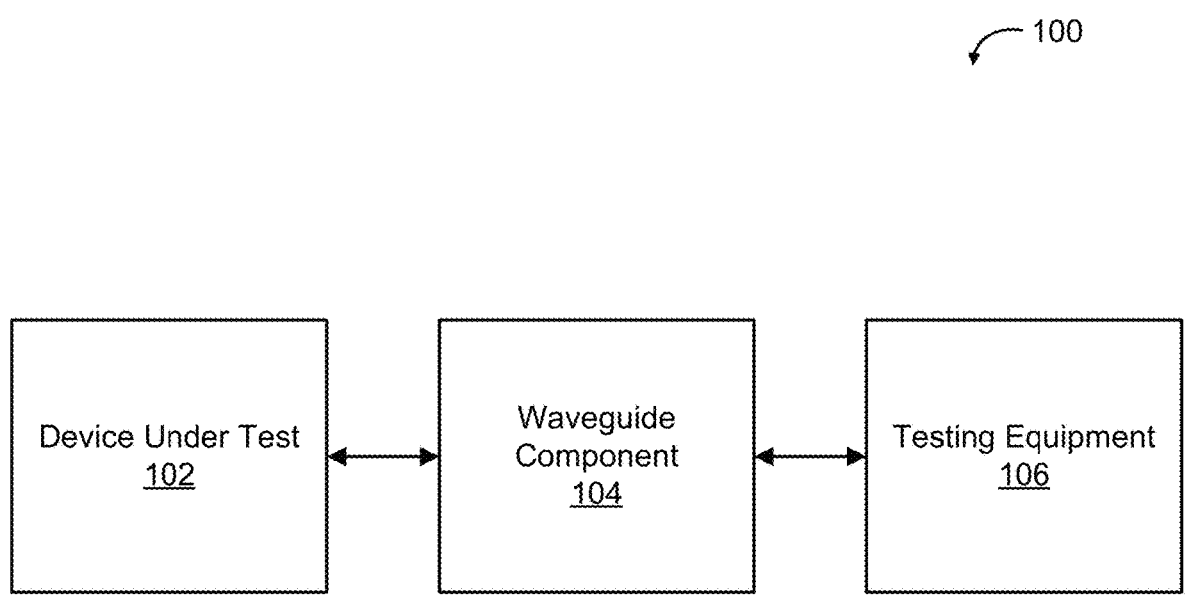
FIG. 1 is a block diagram illustrating an embodiment of a system for performing high-frequency testing.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A waveguide alignment system with dual plates is disclosed. The disclosed system comprises: a base component, a lower plate coupled to the base component, and an upper plate coupled to the lower plate, wherein the upper plate is configured to attach to an electronic testing equipment component. A benefit of the dual-plate system and associated techniques disclosed herein is faster and more reliable testing of devices at high electromagnetic wave frequencies, e.g., in the millimeter wave (mmW) and higher frequency ranges. Further details regarding the disclosed system/techniques and their technical benefits are provided below.

The quality and consistency of connections, e.g., between a device under test (DUT) and electronic testing equipment, can significantly impact measurement results and data accuracy, particularly when the required frequency reaches mmW and THz ranges. In these frequency ranges, waveguide components are utilized to transmit testing signals from electronic testing equipment to DUTs. Waveguide components refer to devices associated with the design, manufacturing, testing, and/or utilization of waveguides. There are many types of waveguide components. Examples of waveguide components include waveguides, various types of waveguide connection/attachment components, waveguide amplifiers/attenuators, various other physical apparatuses that attach to waveguide sections, and various other mechanical and/or electrical components. In many scenarios, waveguide components are utilized to transmit electromagnetic waves from a first waveguide section (e.g., a waveguide section of testing equipment) to a second waveguide section (e.g., a waveguide section of a DUT). Electromagnetic waves can be guided and transmitted from testing equipment to a DUT via a waveguide component without the waveguide component being in physical contact with the testing equipment and/or the DUT.

Waveguides are commonly used transmission media in modern microwave and millimeter wave components, subassemblies, and systems. As used herein, microwave refers to an electromagnetic frequency range that extends from approximately 300 MHz up to 30 GHz, and millimeter wave from approximately 30 GHz to 300 GHz. As used herein, RF includes these frequency ranges. The disclosed system/techniques may also be utilized in the terahertz regions, which is typically defined as 0.3 to 30 THz. As used herein, a waveguide refers to a structure (e.g., a hollow conductive metal pipe) that guides and transmits electromagnetic waves with minimal loss of energy by restricting the transmission of energy to one direction. As used herein, high-frequency testing includes testing and measuring of components at microwave and millimeter wave frequency ranges as well as in the terahertz frequency range. In some embodiments, the disclosed system/techniques are part of a mmW or THz electronic testing equipment setup that includes a vector network analyzer (VNA) and one or more VNA extenders.

FIG. 1 is a block diagram illustrating an embodiment of a system for performing high-frequency testing. In system 100, device under test 102 is connected by waveguide component 104 to testing equipment 106. Examples of device under test 102 include antennas, amplifiers, frequency converters, switches, attenuators, filters, oscillators, or any other type of component for which testing is desired. In various embodiments, testing includes measurement of device gain and/or loss and return loss as a function of frequency or characterization of other device electronic properties. Examples of properties that may be measured include S-parameters, Y-parameters, Z-parameters, H-parameters, various types of gains/losses and return losses associated with microwave frequency and other devices, and so forth. In various embodiments, device under test 102 includes a waveguide section configured to allow high frequency signals to be received from other waveguide sections with minimal loss of energy. Stated alternatively, in various embodiments, device under test 102 includes a waveguide port as an interface to waveguide component 104. The waveguide section of device under test 102 can be of various types. Examples of waveguide types include rectangular waveguides, circular waveguides, elliptical waveguides, single-ridge waveguides, double-ridge waveguides, or any other type of waveguide.

In various embodiments, waveguide component 104 includes a waveguide section to match the waveguide section of device under test 102. For example, waveguide component 104 may include a rectangular waveguide to interface with a rectangular waveguide of device under test 102. Stated alternatively, in various embodiments, a waveguide port of waveguide component 104 interfaces with a waveguide port of device under test 102. In various embodiments, waveguide component 104 also includes another waveguide port on an opposite end to interface with testing equipment 106. In various embodiments, testing equipment 106 transmits measurement signals via a waveguide. In high-frequency testing scenarios, waveguides are utilized in the entire signal transmission pathway from testing equipment 106 to device under test 102 to minimize energy loss.

In some embodiments, (electronic) testing equipment 106 includes a network analyzer or a portion of a network analyzer. A network analyzer refers to an instrument that measures network parameters of microwave, millimeter wave, or THz networks. A common type of network analyzer is a VNA. In some embodiments, waveguide component 104 is physically attached to an extender component of a network analyzer. In this configuration, waveguide component 104 is physically fastened (e.g., using screws) to the microwave, millimeter wave, or THz extender component (e.g., a VNA extender). As described in further detail herein, in various embodiments, testing equipment 106 also includes a rail along which waveguide component 104 can slide to interface with device under test 102. As used herein, a rail can include one or more tracks. A rail with a single track may be referred to as just a track. A single track may also be referred to as a rail. A plurality of tracks may be referred to as a rail system. The block diagram shown in FIG. 1 illustrates logical connections between device under test 102, waveguide component 104, and testing equipment 106. In various physical implementations, device under test 102 is connected to two instances of waveguide component 104 on opposing ends of device under test 102. Furthermore, in various embodiments, testing equipment 106 comprises a testing setup that includes multiple extender components of a network analyzer and a rail system that may, at least in part, be automated.

Figure 2A:
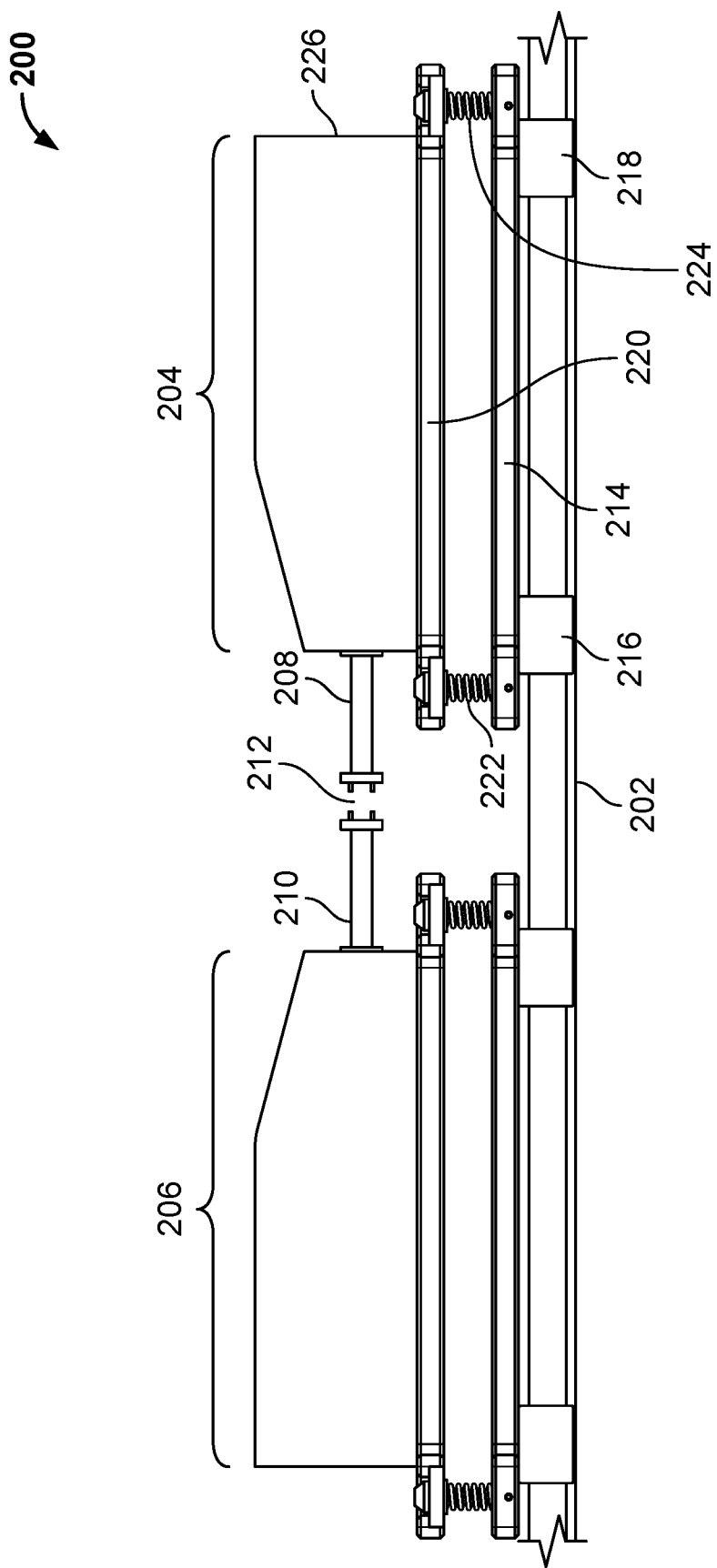

FIGS. 2A-2E are diagrams illustrating an embodiment of a rail-mounted system for high-frequency device testing. FIGS. 2A-2E illustrate different views of rail-mounted system 200. As shown in FIG. 2A, rail-mounted system 200 includes base component 202 along which apparatus 204 and apparatus 206 can move. In various embodiments, base component 202 is a rail with one or more tracks. In the example shown, apparatus 204 is comprised of the same components as apparatus 206. Thus, components and operation of apparatus 204 will be discussed with the understanding that the discussion applies equally to apparatus 206. In some embodiments, base component 202, apparatus 204, and apparatus 206 comprise testing equipment 106 of FIG. 1. Also shown in FIG. 2A are waveguide components 208 and 210, which are connected to apparatuses 204 and 206, respectively. In some embodiments, each of waveguide components 208 and 210 is waveguide component 104 of FIG. 1. In the example shown, a device under test (not shown in FIG. 2A) can be positioned in space 212 between waveguide components 208 and 210. In some embodiments, this device under test is device under test 102 of FIG. 1.

In the example shown, apparatus 204 includes lower plate 214, which is coupled to base component 202 at a plurality of attachment blocks, including attachment blocks 216 and 218. As is shown in other views of rail-mounted system 200, these attachment blocks are able to slide along tracks of base component 202 and thus allow apparatus 204 as a whole to move back and forth along base component 202. In the example shown, apparatus 204 also includes upper plate 220, which is coupled to lower plate 214 via a plurality of spring and screw assemblies, including spring and screw assemblies 222 and 224. These spring and screw assemblies and how they are utilized to allow for precise and efficient alignment adjustment for high-frequency device testing are discussed in further detail herein. As is described in further detail herein, the spring and screw assemblies allow for positioning of upper plate 220 with respect to lower plate 214 to be adjustable. In the example shown, apparatus 204 also includes electronic device 226. In various embodiments, upper plate 220 is configured to attach to an electronic device, such as electronic device 226. For example, electronic device 226 may be fastened to upper plate 220 using screws. In some embodiments, electronic device 226 is a VNA extender that is connected to a VNA (not shown in FIG. 2A). The VNA extender can also be a microwave, THz, and so forth VNA extender. As used herein, VNA extenders can refer to any type of network analyzer component in any frequency range (e.g., microwave, millimeter wave, THz, and so forth). In some embodiments, a device under test is held up by a separate apparatus (e.g., suspended in between waveguide components 208 and 210) so that the device under test can be swapped in and held and waveguide components 208 and 210 are able to be slid against the device under test. In some embodiments, the device under test is held up by alignment pins of waveguide components 208 and 210.

Figure 2B:
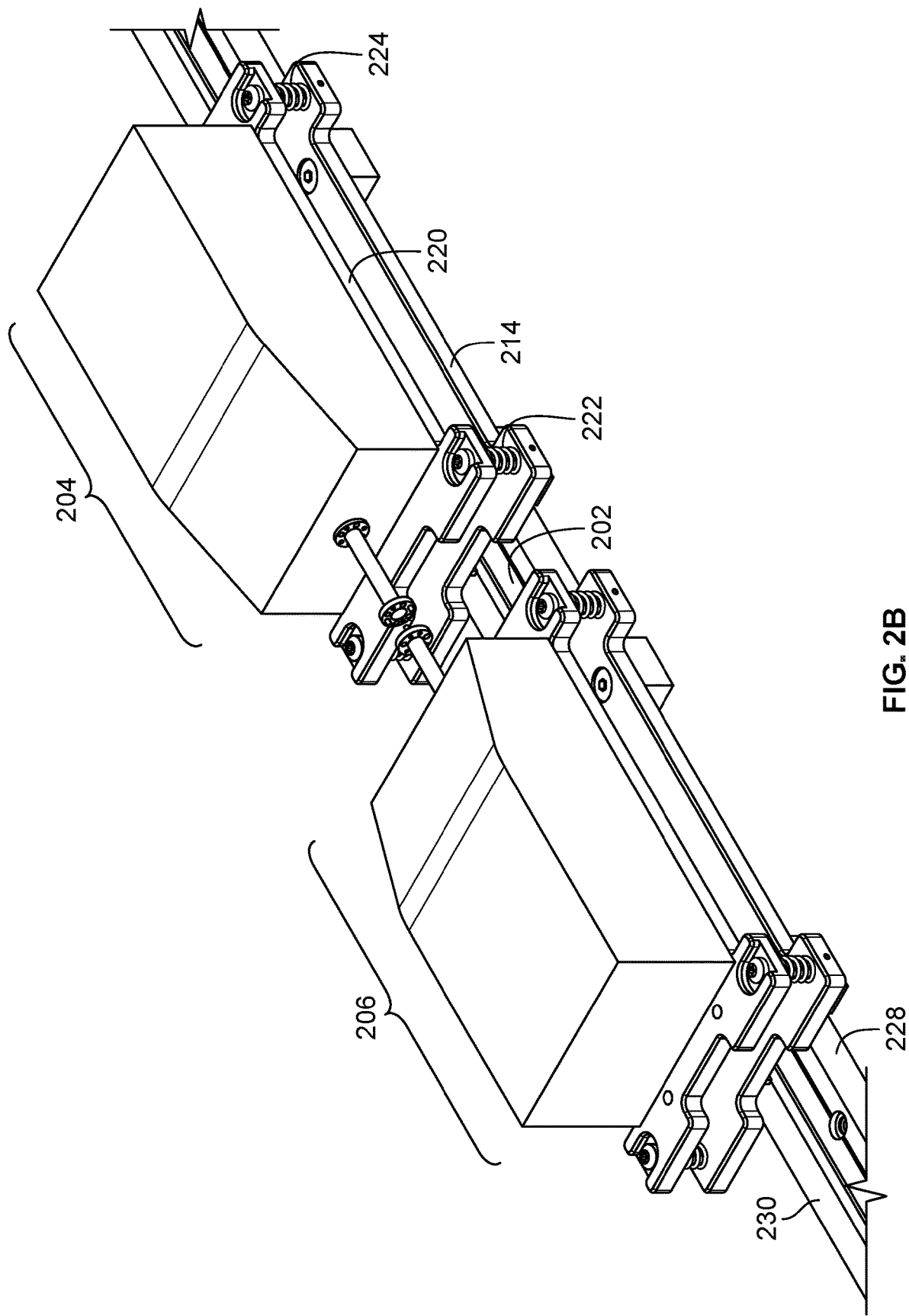
Figure 2C:
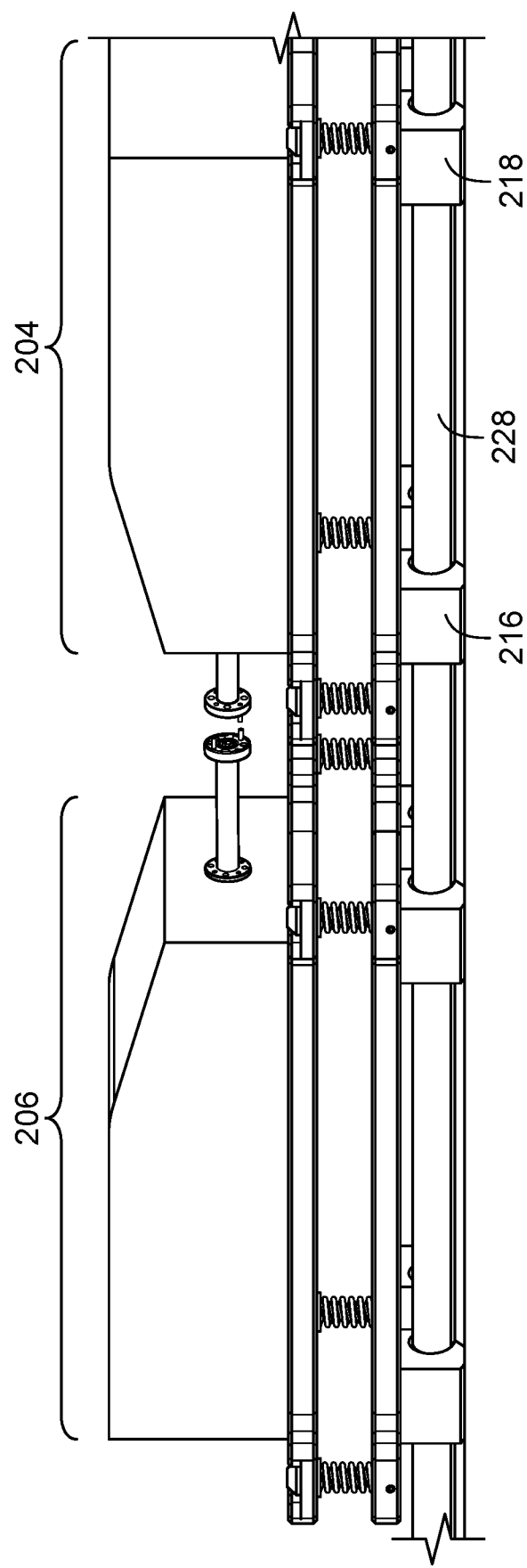
Figure 2E:
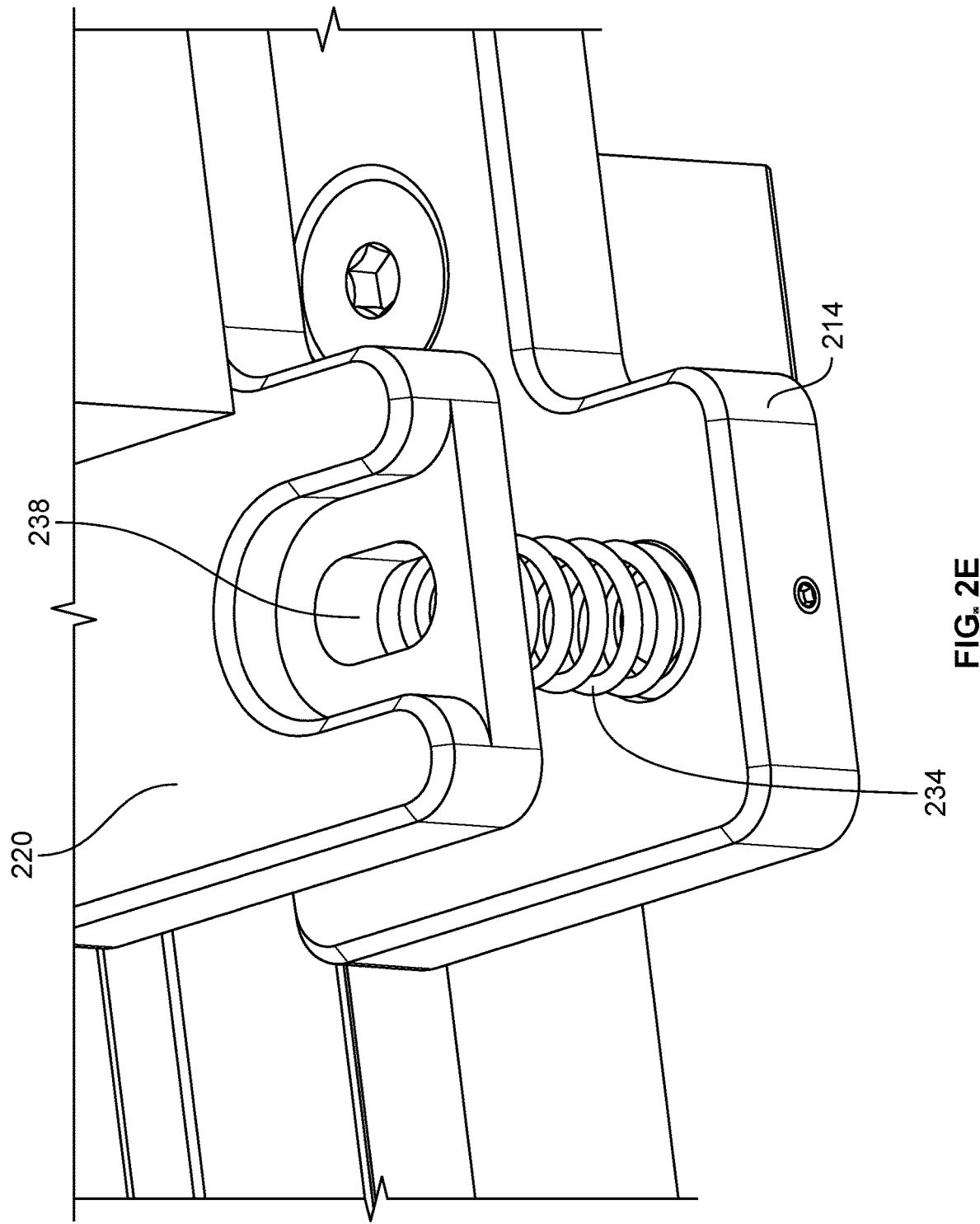
Figure 3:
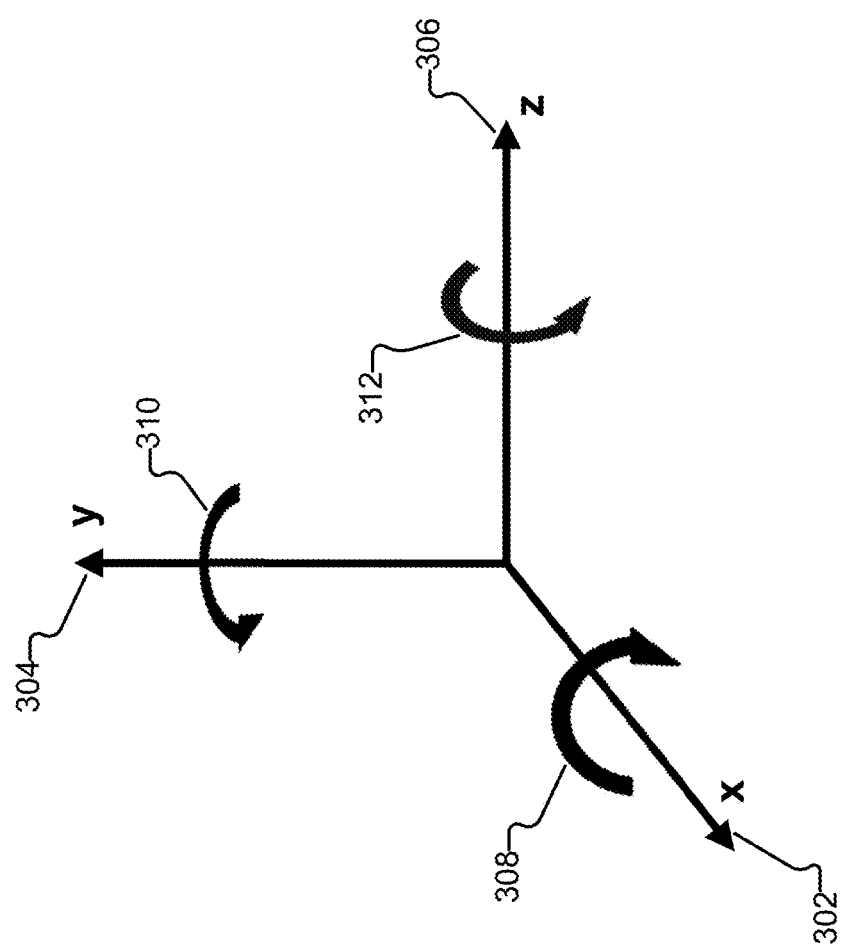
FIG. 3 is a diagram illustrating a three-dimensional coordinate system convention.

With respect to the orientation of rail-mounted system 200 as shown in FIGS. 2A-2E, the three-dimensional coordinate system convention shown in FIG. 3 is applicable. X-axis 302 in FIG. 3 corresponds to the direction pointing into and out of the page in FIG. 2A. Y-axis 304 in FIG. 3 corresponds to the direction pointing vertically from lower plate 214 toward upper plate 220 (stated alternatively, pointing along the long axis of spring and screw assemblies 222 and 224). Z-axis 306 of FIG. 3 corresponds to the direction pointing along the long axis of base component 202. Thus, as used herein, the z-axis is the axis along which apparatuses 204 and 206 move along tracks of base component 202. Apparatuses 204 and 206 can slide toward and away from each other along an axis that is referred to herein as the z-axis. The x-axis and y-axis are defined to be orthogonal to the z-axis. Movement of upper plate 220 along the y-axis corresponds to upper plate 220 moving up or down with respect to lower plate 214. Movement of upper plate 220 along the x-axis corresponds to lateral movement of upper plate 220 (in and out of the page with respect to FIG. 2A). As described in further detail herein, screws of spring and screw assemblies can be utilized to generate rotations 308, 310, and 312 of FIG. 3 about the x-axis, y-axis, and z-axis, respectively.

Another view of rail-mounted system 200 is shown in FIG. 2B. In the view shown in FIG. 2B, it is apparent that base component 202 is comprised of two tracks (tracks 228 and 230) along which apparatuses 204 and 206 can move. It is also apparent that each of apparatuses 204 and 206 includes four spring and screw assemblies. Stated alternatively, spring and screw assemblies 222 and 224 couple lower plate 214 and upper plate 220 along one side (of the z-axis direction) and another pair of spring and screw assemblies couple lower plate 214 and upper plate 220 along the other side.

Another view of rail-mounted system 200 is shown in FIG. 2C. In the view shown in FIG. 2C, the movement of attachment blocks 216 and 218 sliding on track 228 of base component 202 can be better visualized. Corresponding attachment blocks slide on track 230 (not shown) on the other side. FIG. 2D shows a zoomed-in view of rail-mounted system 200. In the view shown in FIG. 2D, fasteners attaching lower plate 214 to attachment blocks can be seen. For example, fastener 232 attaches lower plate 214 to attachment block 216. The fasteners can be screws, bolts, or other types of fasteners. FIG. 2D also clearly shows the spring and screw components of each spring and screw assembly. For example, FIG. 2D shows that spring and screw assembly 222 is comprised of spring 234 and screw 236, with screw 236 encompassed by spring 234. FIG. 2E shows a further zoomed-in view of rail-mounted system 200. FIG. 2E focuses on the portion of lower plate 214 and upper plate 220 that is connected by spring and screw assembly 222. For the purposes of illustrative clarity, in FIG. 2E, only spring 234 is shown. Screw 236 is omitted so that the slot (an opening/aperture) of upper plate 220 into which spring and screw assembly 222 fits (slot 238) can be clearly visualized. In various embodiments, slot 238 is larger in size that what is strictly necessary to accommodate screw 236 (larger than the shank of screw 236 but not necessarily larger than the head of screw 236). Having a larger-sized slot 238 (and other slots for the other spring and screw assemblies) has an advantage of allowing for additional freedom of movement of upper plate 220 in the plane defined by the x and z axes as well as freedom of rotation about the y-axis (rotation 310 in FIG. 3).

Movement of upper plate 220 in the directions illustrated in FIG. 3 can be accomplished by adjustment (e.g., loosening and tightening) of the various screws of the various spring and screw assemblies associated with upper plate 220. Adjustment may be required, for example, because of an irregularity and/or misalignment of the attachment between waveguide component 208 and electronic device 226, which could cause two testing equipment components (e.g., two VNA extenders) to be misaligned. Another example of a minor variation in the dimensional or positional tolerance of a component that can make the alignment process difficult is if the thicknesses of lower plates of apparatuses 204 and 206 are different. Therefore, a combination of roll, pitch, and yaw movements may be required to align waveguide components 208 and 210 to allow for a tight connection to a DUT placed in space 212. As described herein, a mechanism involving screw-guided springs can be utilized. The screws are easily accessible from the top and can be tightened or loosened causing the springs to contract or retract, thus providing the adjustment required along the x, y, and/or z axes. The techniques disclosed herein provide for more efficient adjustment than prior, more time-consuming approaches, such as using thickness shims.

Figure 4:
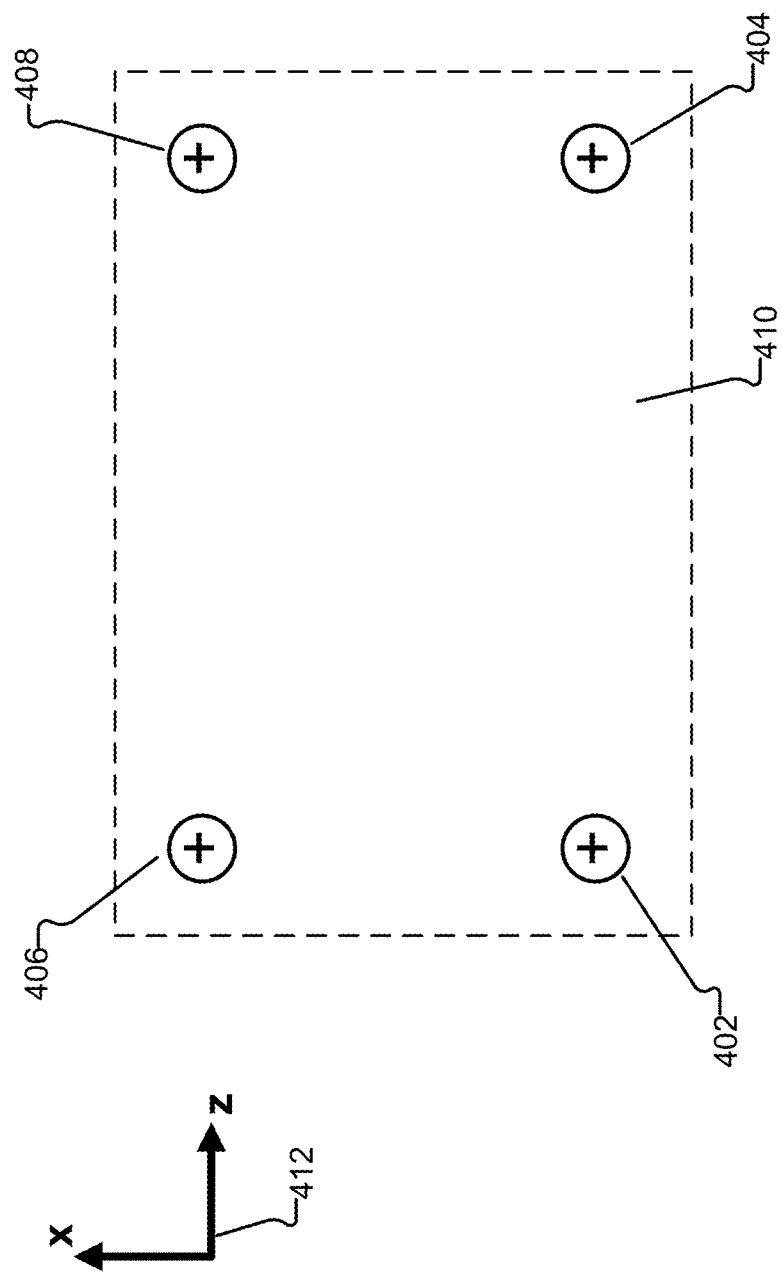
FIG. 4 is a diagram illustrating effects of adjusting different alignment screws.

A diagrammatic illustration of the locations of the various screws of upper plate 220 is shown in FIG. 4. Screw 402 of FIG. 4 corresponds to screw 236. Screw 404 of FIG. 4 corresponds to the screw of spring and screw assembly 224. Stated alternatively, screws 402 and 404 of FIG. 4 line up on the track 228 side of base component 202. Screws 406 and 408 of FIG. 4 line up on the track 230 side of base component 202. Box 410 in FIG. 4 diagrammatically represents upper plate 220 and has orientation 412. Stated alternatively, a line connecting screws 402 and 404 would be parallel to the z-axis, a line connecting screws 402 and 406 would be parallel to the x-axis, and so forth. The y-axis (not shown) would be running in/out of the page. Movement of upper plate 220 up and down with respect to lower plate 214 (movement along the y-axis direction) without tilting upper plate 220 with respect to lower plate 214 can be accomplished by adjusting all of the screws together by an equal amount. Upper plate 220 can also be moved laterally in the x-axis direction by sliding screws within their slots (e.g., within slot 238) because, in various embodiments, slots for screws, such as slot 238, are larger than is strictly necessary to accommodate the screws. Upper plate 220 naturally moves in the z-axis direction along with the rest of apparatus 204 because apparatus 204 slides along tracks 228 and 230.

Rotational adjustment of upper plate 220 can also performed. Rotation about the x-axis (rotation 308 of FIG. 3) can be performed by differentially adjusting front screws (screws 402 and 406) and back screws (screws 404 and 408). For example, to tilt downward (toward lower plate 214) the side of upper plate 220 that is closer to waveguide component 208, screws 402 and 406 can be tightened while not tightening screws 404 and 408. Rotation about the y-axis (rotation 310 of FIG. 3) can be performed by sliding the screws within their slots in a twisting manner. The amount of rotational adjustment about the y-axis may be minimal and depends on how much bigger the slots are than the screws. Rotation about the z-axis (rotation 312 of FIG. 3) can be performed by differentially adjusting screws on the track 228 side (screws 402 and 404) and screws on the track 230 side (screws 406 and 408). For example, to tilt the side of upper plate 220 on the track 228 side downward toward base component 202, screws 402 and 404 can be tightened while not tightening screws 406 and 408.

In various embodiments, each spring (e.g., spring 234) is a screw-guided, high-rated compression spring. Each corresponding screw (e.g., screw 236 with respect to spring 234) acts against the corresponding spring to keep the corresponding spring under tension and stabilize movements of components of rail-mounted system 200. In some embodiments, once a desired alignment is achieved, separate set screws can be used to restrict any movements of alignment screws (e.g., restrict movement of screw 236). These set screws are optional and not strictly necessary. The springs described herein may also be referred to as variable springs, and the alignment screws associated with these springs may also be referred to as variable screws. An advantage of the techniques disclosed herein is that because testing equipment is mounted on a rail, freedom of movement is already limited and the testing equipment components (e.g., two VNA extenders) have each other as references. Thus, a consistent reference frame is provided, and efficient alignment can be performed by iteratively tightening various alignment screws until a DUT does not move (e.g., does not wiggle).

Rail-mounted system 200 is merely an example embodiment of the techniques disclosed herein. Other embodiments are also possible. For example, it is possible to configure tracks 228 and 230 to have a larger gap in between them, mount apparatus 204 and/or apparatus 206 to additional tracks that are perpendicular to tracks 228 and 230, and then attach the additional tracks on top of tracks 228 and 230. Such a configuration would allow for movement of apparatus 204 and/or apparatus 206 in the x-axis direction with respect to each other without sliding variable screws within their screw slots. Such a configuration would allow for offset testing of DUTs. This an option for alternative embodiments; though, in many scenarios, this extra degree of freedom of movement may not be desirable because it may make alignment adjustments more difficult. It is also possible to install an additional layer in between the aforementioned additional tracks and apparatus 204 and/or apparatus 206. In this additional layer, for apparatus 204 and/or 206, a plate with a turntable can be mounted on the additional tracks and attached to the underside of the corresponding apparatus (e.g., apparatus 204 or 206) such that the apparatus can be rotated about the y-axis to allow for rotation 310 of FIG. 3. Such a configuration would allow for angular testing of DUTs; though, in many scenarios, this extra degree of freedom of movement may not be desirable because it may make alignment adjustments more difficult. It is also possible to automate rail-mounted system 200 in alternative embodiments. Movement in the z-axis direction, in the x-axis direction (e.g., using the aforementioned additional tracks), and/or about the y-axis (e.g., using the aforementioned turntable) can be automated using motorized parts. In an automated setup, the lengths of waveguide components can be made shorter because no working distance for human hands to manually place a DUT is needed. Motorized movement may be controlled by a computer or other programmable system. An advantage of an automated setup is potentially higher throughput for testing of DUTs.

FIG. 3 is a diagram illustrating a three-dimensional coordinate system convention. FIG. 3 is described in detail above in the description associated with FIGS. 2A-2E.

FIG. 4 is a diagram illustrating effects of adjusting different alignment screws. FIG. 4 is described in detail above in the description associated with FIGS. 2A-2E.

Figure 5:
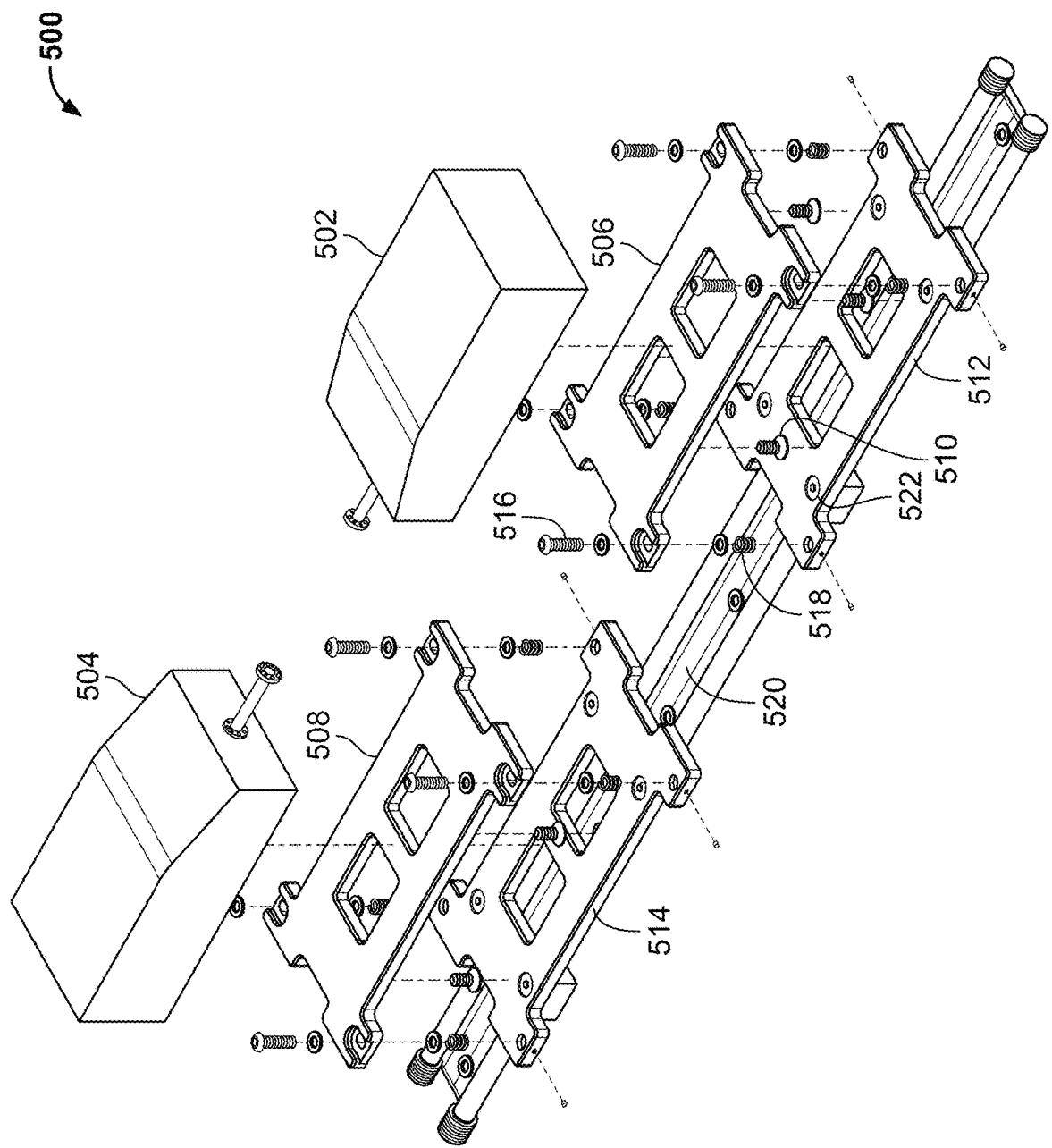
FIG. 5 is an exploded-view illustration of a rail-mounted system for high-frequency device testing.

FIG. 5 is an exploded-view illustration of a rail-mounted system for high-frequency device testing. In some embodiments, rail-mounted system 500 is rail-mounted system 200 of FIGS. 2A-2E. In the example shown, electronic testing equipment components 502 and 504 are attached to upper plates 506 and 508, respectively, with mounting screws, e.g., mounting screw 510. Upper plates 506 and 508 are attached to lower plates 512 and 514, respectively, with screws and associated springs, e.g., screw 516 and spring 518. Lower plates 512 and 514 are attached to sliding mounts of rail base component 520 with additional fasteners. These fasteners may include nuts and bolts, e.g., at location 522.

Figure 6:
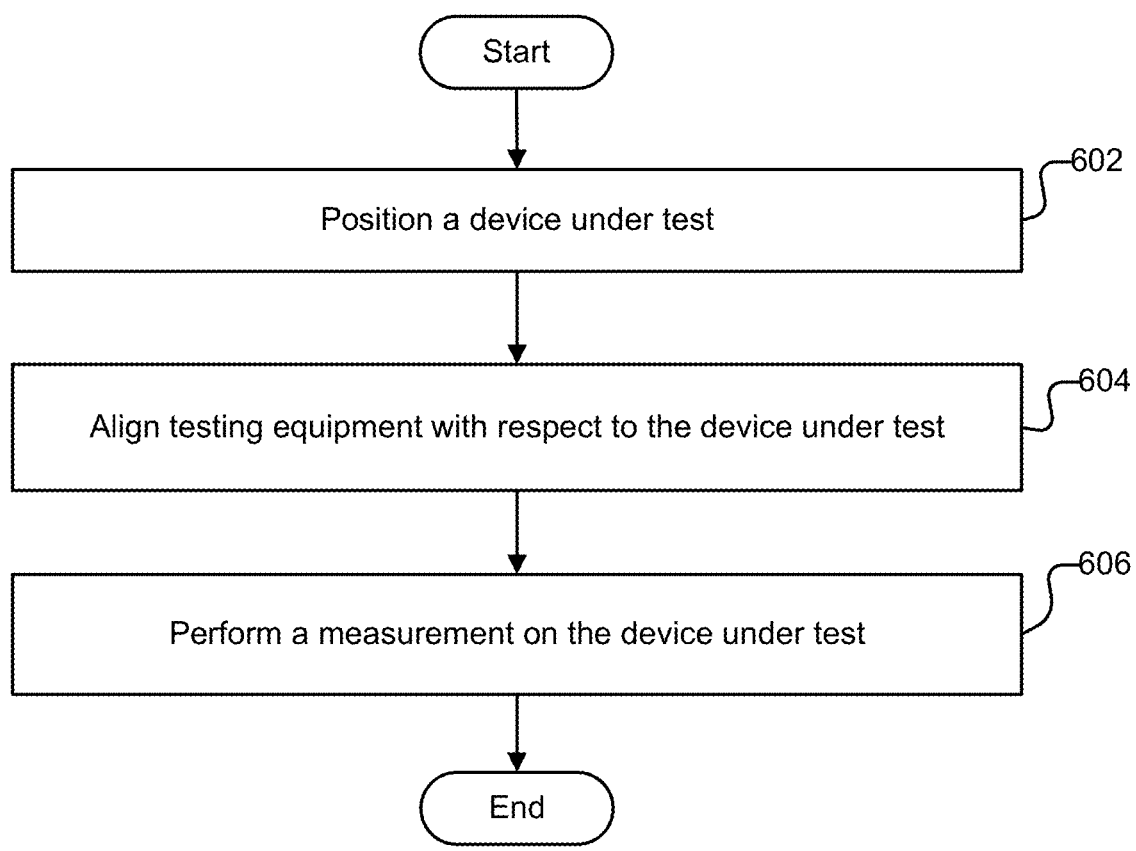
FIG. 6 is a flow chart illustrating an embodiment of a process for performing a measurement on a device under test.

FIG. 6 is a flow chart illustrating an embodiment of a process for performing a measurement on a device under test. In some embodiments, testing equipment 106 of FIG. 1, rail-mounted system 200 of FIGS. 2A-2E, and/or rail-mounted system 500 of FIG. 5 is utilized to perform the measurement.

At 602, a device under test is positioned. In various embodiments, the device under test is aligned with one or more waveguide components (e.g., waveguide components 208 and 210 of FIG. 2A). In various embodiments, aligning the device under test includes positioning the device under test in between the waveguide components. In some embodiments, a robotic arm places the device under test between the waveguide components. It is also possible to manually place the device under test. In some embodiments, aligning the device under test is an automated process controlled by a computer or other programmable system.

At 604, testing equipment is aligned with respect to the device under test. In various embodiments, aligning the testing equipment includes adjusting an upper plate (e.g., upper plate 220 of FIG. 2A) using a plurality of screw-guided springs. The alignment can start with some tension on the springs to avoid movement of the upper plate. In various embodiments, a lower plate (e.g., lower plate 214 of FIG. 2A) is pushed to move the testing equipment (e.g., apparatus 204 of FIG. 2A) so as to avoid sudden movements of the upper plate. In some embodiments, after satisfactory alignment has been achieved, set screws are utilized to avoid any accidental movement of the screw-guided springs and their associated screws.

At 606, a measurement is performed on the device under test. In various embodiments, performing a measure includes utilizing testing equipment to transmit to and receive signals from the device under test. The measurement is oftentimes associated with a device gain and/or loss at a specified frequency or as a function of frequency. Examples of properties that may be measured include S-parameters, Y-parameters, Z-parameters, H-parameters, various types of gains/losses associated with microwave frequency and other devices, and so forth.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A waveguide alignment system, comprising:
    a base component, wherein the base component includes a rail;
    a lower plate coupled to the base component; and
    an upper plate coupled to the lower plate, wherein the upper plate is configured to attach to an electronic testing equipment component,
    wherein the electronic testing equipment component is coupled to a waveguide component comprising one or more alignment pins that are configured to engage a device under test.

2. The waveguide alignment system of claim 1, wherein the rail includes two parallel tracks.

3. The waveguide alignment system of claim 1, wherein the base component further includes a plurality of attachment block units configured to slide along the rail.

4. The waveguide alignment system of claim 3, wherein the lower plate is coupled to the plurality of attachment block units.

5. The waveguide alignment system of claim 1, further comprising at least one spring and screw assembly.

6. The waveguide alignment system of claim 5, wherein the at least one spring and screw assembly includes a screw positioned at least in part within a compression spring.

7. The waveguide alignment system of claim 5, wherein the upper plate is coupled to the lower plate at least in part via the at least one spring and screw assembly.

8. The waveguide alignment system of claim 5, wherein the at least one spring and screw assembly is configured to maintain an adjustable gap between the upper plate and the lower plate.

9. The waveguide alignment system of claim 1, further comprising a plurality of fasteners that couple the base component to the lower plate.

10. The waveguide alignment system of claim 1, further comprising a plurality of mounting screws that attach the electronic testing equipment component to the upper plate.

11. The waveguide alignment system of claim 1, wherein the electronic testing equipment component is an extension component of a network analyzer.

12. The waveguide alignment system of claim 1, wherein the waveguide component comprises a waveguide section.

13. The waveguide alignment system of claim 12, wherein the waveguide section of the waveguide component is configured to connect to a corresponding waveguide section of the device under test.

14. The waveguide alignment system of claim 13, wherein the device under test comprises an antenna, amplifier, frequency converter, switch, attenuator, filter, or oscillator.

15. The waveguide alignment system of claim 1, wherein the electronic testing equipment component is connected to a network analyzer.

16. The waveguide alignment system of claim 15, wherein the network analyzer is configured to perform measurements on a device under test in a millimeter wave or higher electromagnetic frequency range.

17. The waveguide alignment system of claim 1, wherein the upper plate includes an opening with an opening size that allows passage through the opening of a shank and threads of a screw but not a head of the screw.

18. A method, comprising:
aligning a device under test in a waveguide alignment system, comprising:
 a base component, wherein the base component includes a rail;
 a lower plate coupled to the base component; and
 an upper plate coupled to the lower plate, wherein the upper plate is configured to attach to an electronic testing equipment component, the electronic testing equipment component is coupled to a waveguide component comprising one or more alignment pins that are configured to engage a device under test; and
causing electromagnetic waves to be transmitted through the electronic testing equipment component to the device under test.

19. A waveguide alignment system, comprising:
a first apparatus, comprising:
 a first base component, wherein the first base component includes a rail;
 a first lower plate coupled to the first base component; and
 a first upper plate coupled to the first lower plate, wherein the first upper plate is configured to attach to a first electronic testing equipment component; and
a second apparatus, comprising:
 a second base component;
 a second lower plate coupled to the second base component; and
 a second upper plate coupled to the second lower plate, wherein the second upper plate is configured to attach to a second electronic testing equipment component; and
wherein;
 the first apparatus and the second apparatus are configured to interface with a device under test; and
 the first electronic testing equipment component is coupled to a first waveguide component comprising one or more alignment pins that are configured to engage a device under test.

* * * * *